United States Patent [19]
Hook et al.

[11] Patent Number: 5,898,196
[45] Date of Patent: Apr. 27, 1999

[54] DUAL EPI ACTIVE PIXEL CELL DESIGN AND METHOD OF MAKING THE SAME

[75] Inventors: Terence B. Hook, Jericho Center, Vt.; Hon-Sum P. Wong, Chappaqua, N.Y.

[73] Assignee: International Business Machines Corporation, Armonk, N.Y.

[21] Appl. No.: 08/948,739

[22] Filed: Oct. 10, 1997

[51] Int. Cl.⁶ .................. H01L 31/062; H01L 31/113; H01L 29/76

[52] U.S. Cl. .................. 257/292; 257/291; 257/436; 257/464

[58] Field of Search .................. 257/290, 291, 257/292, 436, 464

[56] References Cited

U.S. PATENT DOCUMENTS

| | | |
|---|---|---|
| 4,613,895 | 9/1986 | Burkey et al. . |
| 4,700,233 | 10/1987 | Toshiaki . |
| 4,847,210 | 7/1989 | Hwang et al. . |
| 4,904,607 | 2/1990 | Riglet et al. . |
| 5,239,193 | 8/1993 | Benton et al. ............ 257/292 |
| 5,481,124 | 1/1996 | Kozuka et al. . |
| 5,567,971 | 10/1996 | Jackson et al. . |
| 5,581,094 | 12/1996 | Hara et al. . |
| 5,631,704 | 5/1997 | Dickinson et al. ......... 257/292 |
| 5,739,592 | 4/1998 | Ackland et al. ........... 257/291 |

*Primary Examiner*—Ngân V. Ngô
*Attorney, Agent, or Firm*—Delio & Peterson, LLC; Peter W. Peterson; Eugene I. Shkurko

[57] ABSTRACT

The present invention is a dual epi active pixel sensor cell having a p– region of dual thickness and a method of making the same. The dual epi active pixel sensor cell produces a sensor with improved noise and latch-up reduction and improved red absorption. The thin p– epi region is positioned in the logic region for improved latch-up immunity. The thick p– epi is positioned in the pixel region for improved red absorption.

8 Claims, 8 Drawing Sheets

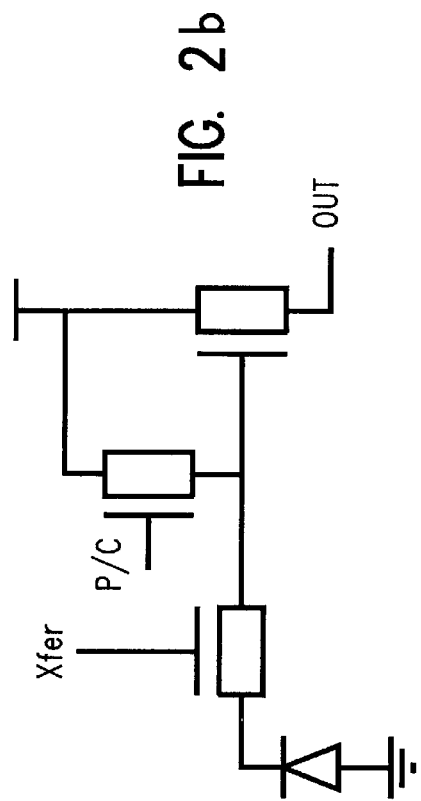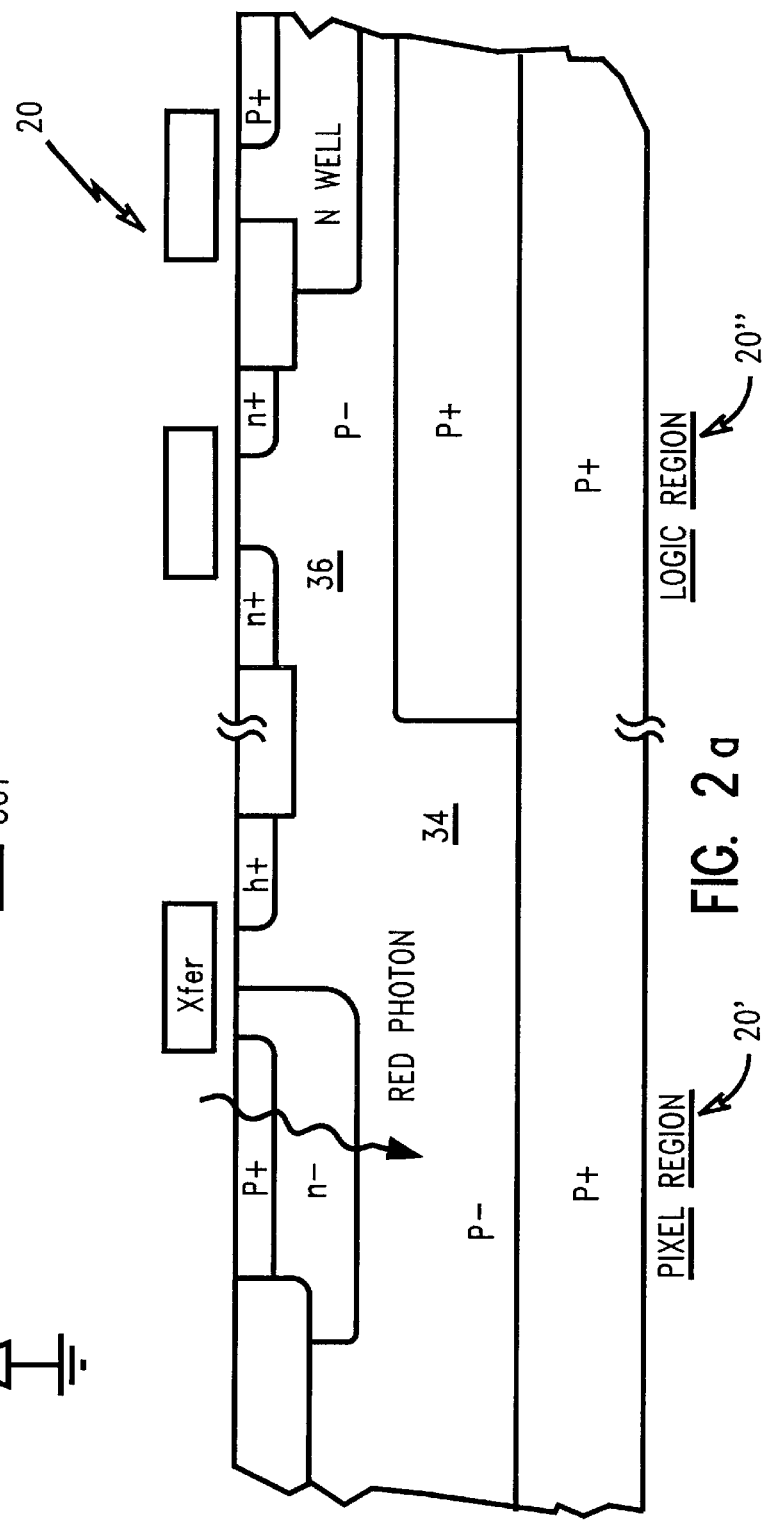

DUAL EPI ACTIVE PIXEL CELL DESIGN AND METHOD OF MAKING THE SAME

BACKGROUND OF THE INVENTION

1. Field of the Invention

The present invention relates to active pixel sensors and in particular to an active pixel sensor which provides improved red absorption while providing improved latch-up and noise reduction.

2. Description of the Related Art

A conventional Active Pixel Sensor (APS) cell consists of an np diode in the p-type substrate, an NFET transfer device, a source-follower amplifying transistor, a pre-charge transistor, and a bit switch transistor. Electron-hole pairs are produced in the diode by impinging photons. The electrons are collected in the pre-charged n region of the diode, and eventually transferred to the source-follower gate for amplification. A p-type pinning layer is often included at the surface of the diode.

FIG. 1a illustrates a schematic cross-section of the photodiode and the transfer gate. FIG. 1b illustrates the schematic of the circuit embodied in each Active Pixel Sensor device 10. The number of electrons collected determines the level of gate drive on the source-follower transistor 12. The source potential is transferred down the column through the bit switch 14, where it can be processed appropriately for video imaging.

Photons are absorbed by the silicon in the pre-charged n region of the diode at various depths, depending on the photon energy. Long wavelength photons have an absorption depth of 5 or more micrometers. Electron-hole pairs are created when the photons are absorbed, and provided that this creation occurs within a diffusion length of the depletion region, they will be collected by the photodiode and contribute to the optical signal.

Heavily-doped silicon has a short diffusion length, so a deep region of lightly-doped material is preferable to enable the collection of the electron-hole pairs generated by long wavelength red photons. However, high performance CMOS technologies of the type preferred for the logic areas outside of the photodiode use a shallow lightly-doped region for latch-up immunity and to provide a quiet substrate. This causes difficulties when integrating the manufacturing steps needed for the APS device with the manufacturing steps needed for the high performance CMOS logic areas.

Bearing in mind the problems and deficiencies of the prior art, it is therefore an object of the present invention to provide an active pixel cell device which optimizes red response and latch-up simultaneously.

It is another object of the present invention to provide an active pixel sensor which allows easy integration with existing embedded microprocessor and analog designs necessary for the high level of integration required by products using APS technology.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an active pixel sensor cell having a substrate doped at a first concentration, a plurality of photosensitive devices and logic devices, a layer doped at a second concentration extending a first distance from the top surface of the substrate into the substrate beneath at least some of the devices, and said layer doped at a second concentration extending a second distance, which is greater than the first distance, from said top surface into said substrate beneath at least some of the photosensitive devices.

This invention also includes a method of making an active pixel sensor device in which the p− layer has a varying thickness. In the logic region the p− layer has a first thickness and in an adjacent pixel region the p− layer has a second thickness which is greater than the thickness of the p− layer in the logic region.

The method of making the active pixel sensor device includes the steps of:

(a) providing a p type wafer substrate having a p+ region and a p− epi region wherein a portion of the p+ and p− region defines a logic region and another portion of the p+ and p− regions defines a pixel region.

(b) implanting a p+ region in the p− epitaxy region positioned in the logic region;

(c) creating a p− epitaxy layer on the substrate above the logic and pixel regions.

In another aspect, the method of the invention includes the steps of:

(a) providing a p+ wafer substrate wherein a portion of the p+ region defines a logic region and another portion of the p+ region defines a pixel region;

(b) etching the pixel region and growing p− silicon in the pixel region;

(c) creating a p− epitaxy layer on the substrate above the logic and pixel regions.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1b is a schematic diagram of the active pixel sensor cell of FIG. 1a.

FIG. 2a is a cross-sectional view of the active pixel sensor cell of the present invention.

FIG. 2b is a schematic diagram of the active pixel sensor cell of FIG. 2a.

DESCRIPTION OF THE PREFERRED EMBODIMENT(S)

Figure 1A:
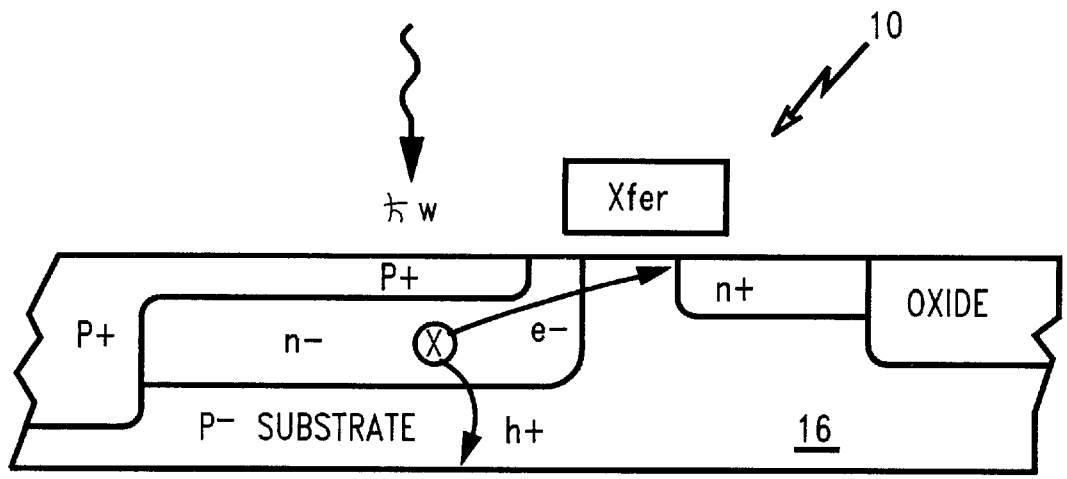
FIG. 1a is a cross-sectional view of a prior art active pixel sensor cell.
Figure 1B:
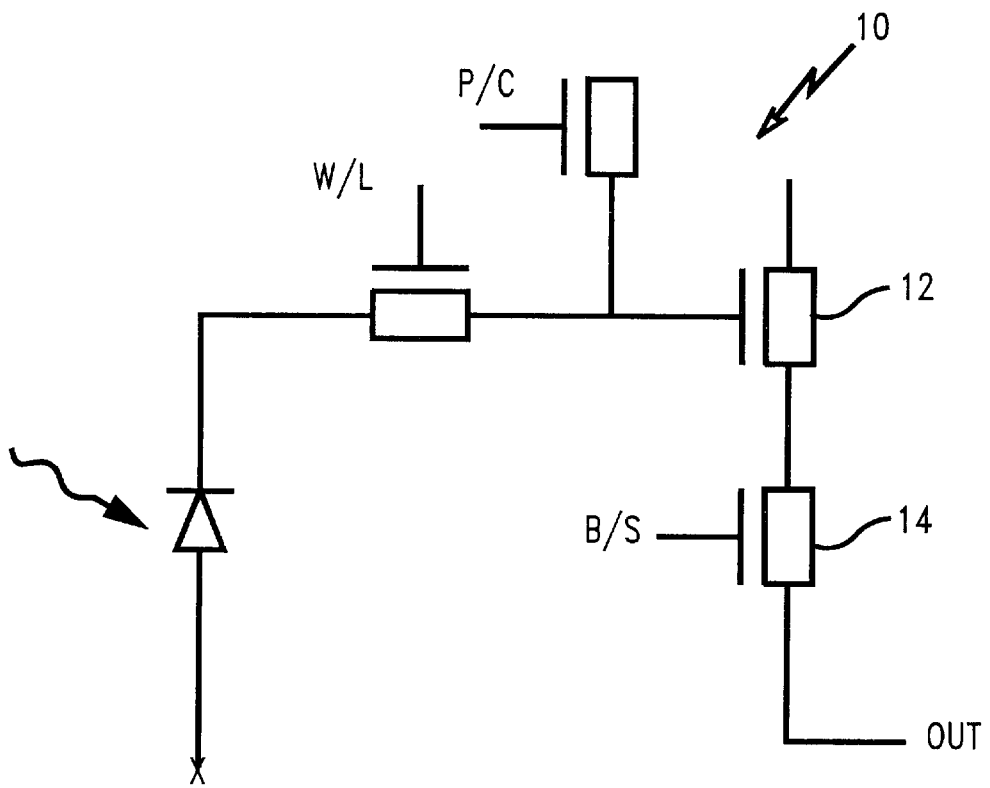

In describing the preferred embodiment of the present invention, reference will be made herein to FIGS. 1–5 of the drawings in which like numerals refer to like features of the invention. FIG. 2 illustrates a cross sectional view of the referred embodiment of the present invention 20. A thick p– mepi area 36 of approximately 5 microns or greater is used in the diode areas, while thin p– areas 36 of approximately 2 microns is used in logic areas. The thick p– epi area allows for improved absorption of red light which has an absorption length of 5 to 10 microns. The thick region 34 is in the pixel region 20' and the thin region 36 is in the logic region 20". The logic region 20" and the pixel region 20' must be present on the same wafer; however, the distance between the regions is not significant. Further, the logic region may include any number of logic devices, including, but not limited to decoders, embedded microprocessors and signal processing elements.

The active pixel sensor cell device 20 of the present invention may be made using a combination of methods employed in CMOS manufacturing including ion implantation and epitaxy technology. The methods can produce an active pixel sensor cell device having a pixel region 20' with a thick p– area for improved red absorption in the pixel region 20' and a thin p– area for improved noise and latch-up reduction in the logic area 20".

Figure 3A:
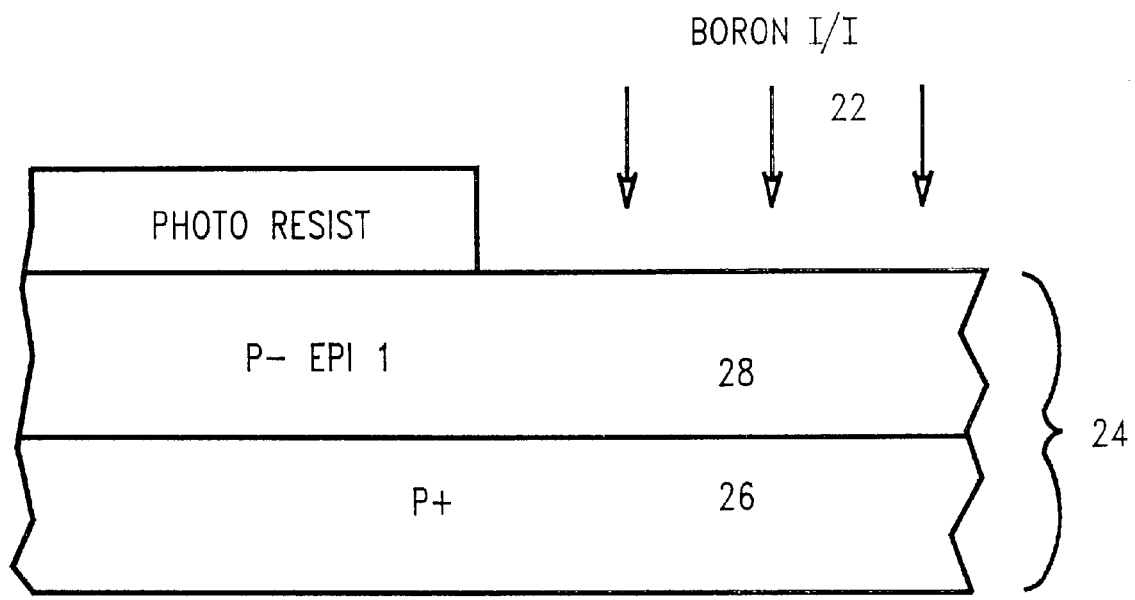
FIGS. 3a–3c illustrate masked implant and epitaxy steps for producing the dual epi active pixel sensor cell of the present invention.
Figure 3B:
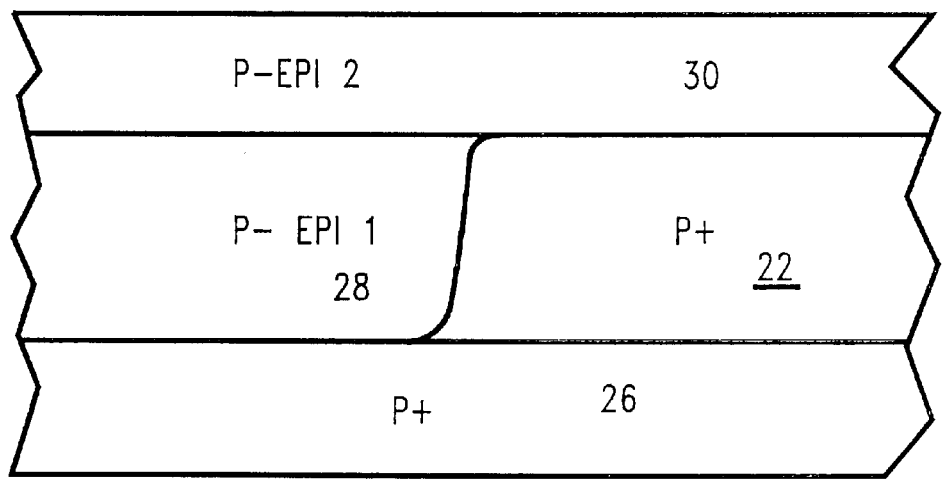
Figure 3C:
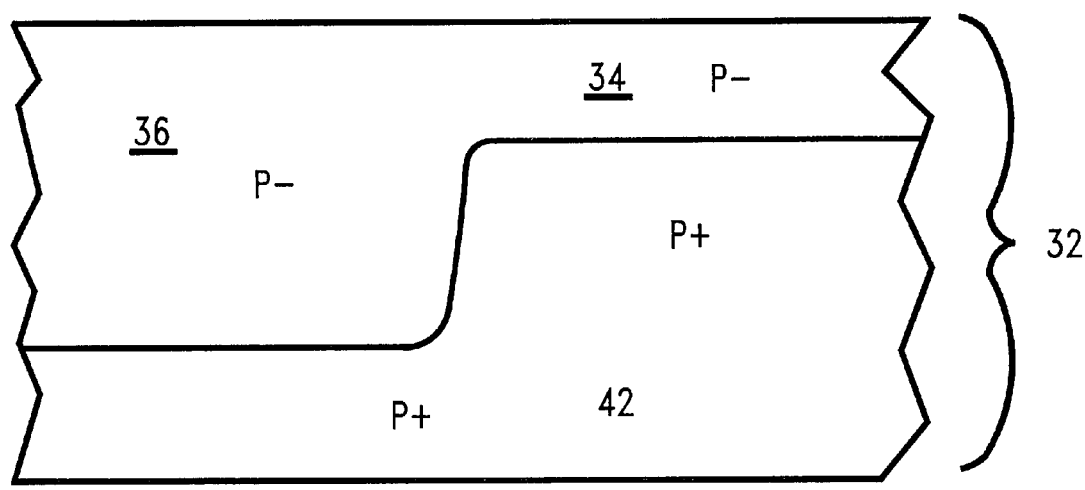
Figure 4:
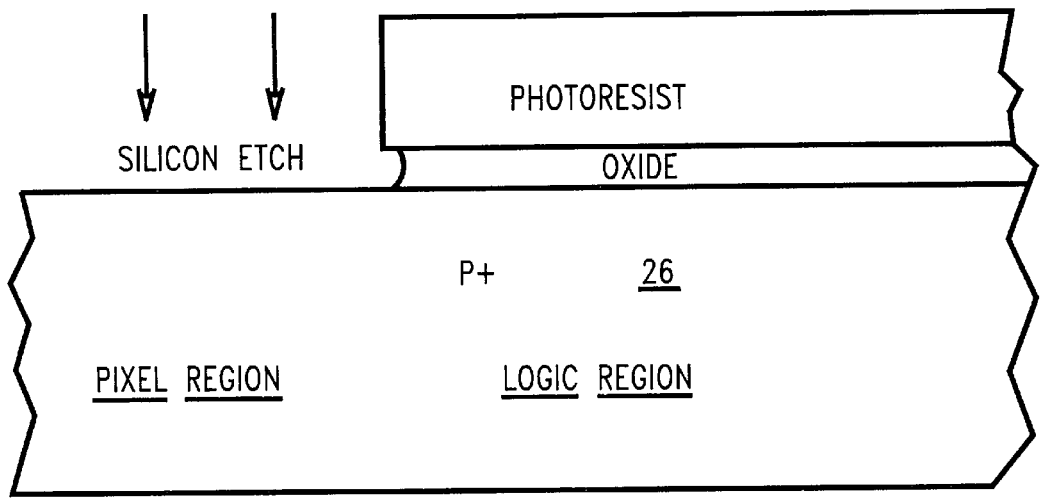
FIGS. 4a–4d illustrate trench etch and epitaxy steps for producing the dual epi active pixel sensor cell of the present invention.
Figure 4:
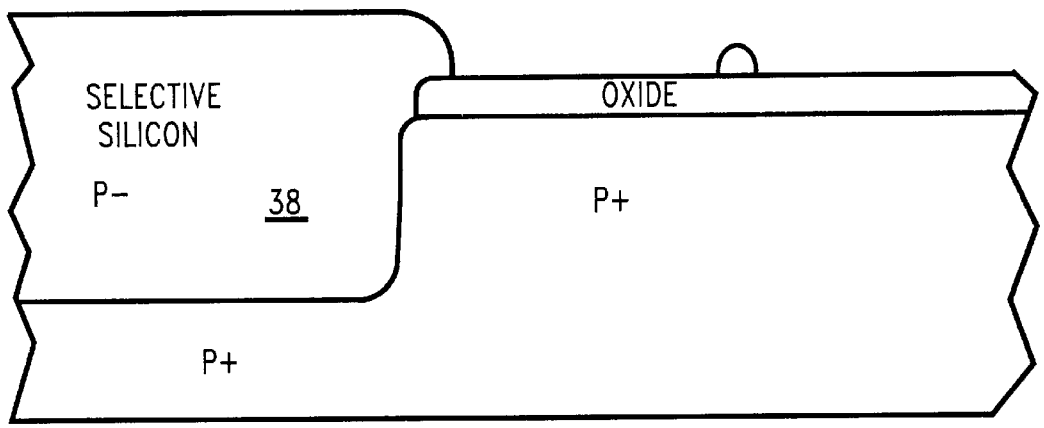
Figure 4:
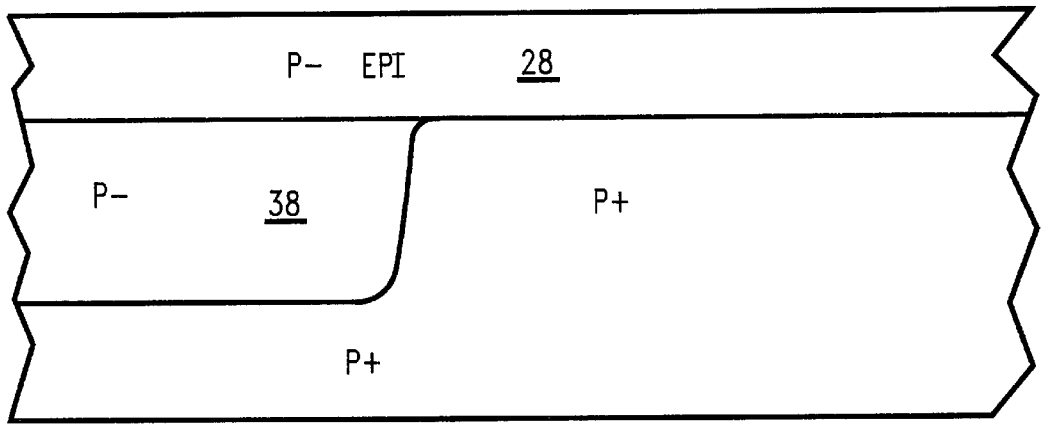
Figure 4D:
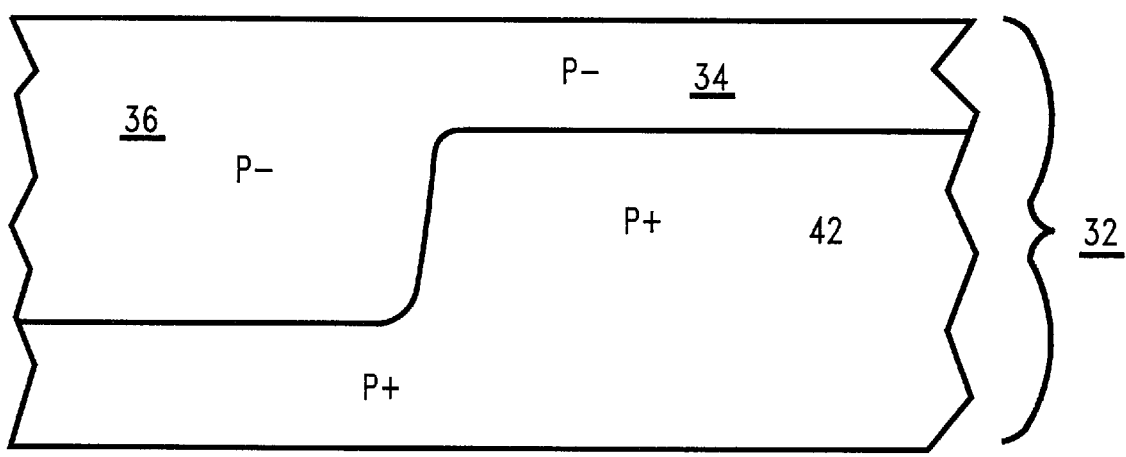

One method, illustrated by FIGS. 3a–c comprises ion implantation of boron or p-type ions into a substrate 24 which comprises a p+ layer 26 and a p– epitaxial layer 28. After implantation, a second epitaxial layer 30 is grown on the substrate 24 as illustrated in FIG. 3b. The resulting substrate 32, illustrated in FIG. 5d includes a thin p– area 34, thick p– area 36 and p+ region 42.

Another method, illustrated by FIGS. 4a–d begins with a p+ substrate 26. A silicon etch is performed in the pixel region and the etched area is filled with a p– silicon layer 38 as illustrated in FIG. 4b. By adjusting processing conditions in a well known manner, silicon is prevented from forming over the oxide left in the logic region. The substrate is polished to planarity and a p– epi layer 28 is grown on the substrate. The resulting substrate 32, illustrated in FIG. 4d includes a thin p– area 34, thick area 36 and p+ region 42.

Figure 5A:
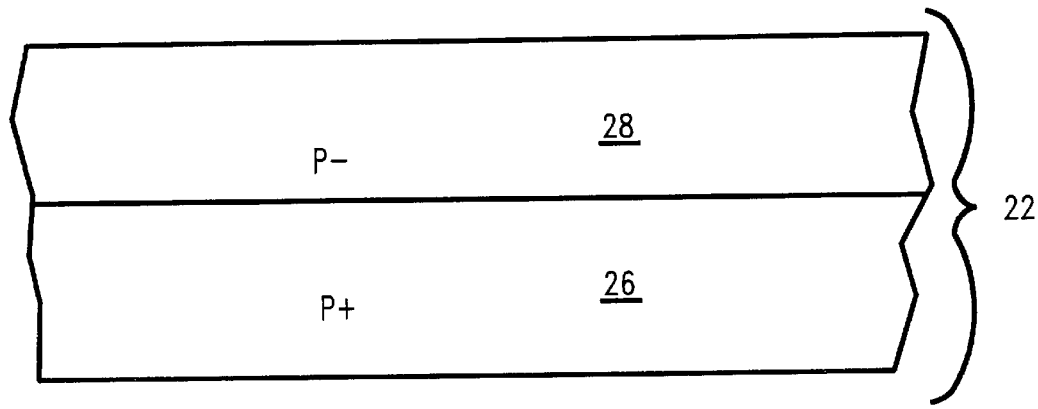
FIGS. 5a–5d illustrate deep implant steps for producing the dual epi active pixel sensor cell of the present invention.
Figure 5B:
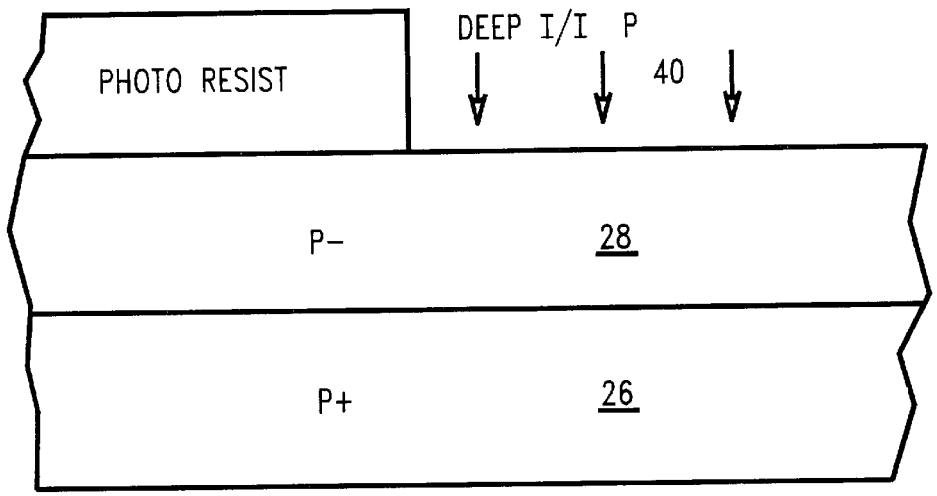
Figure 5C:
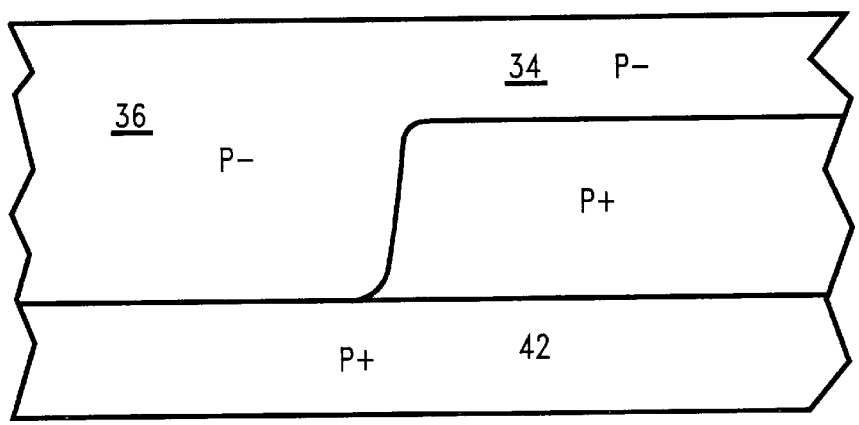
Figure 5D:
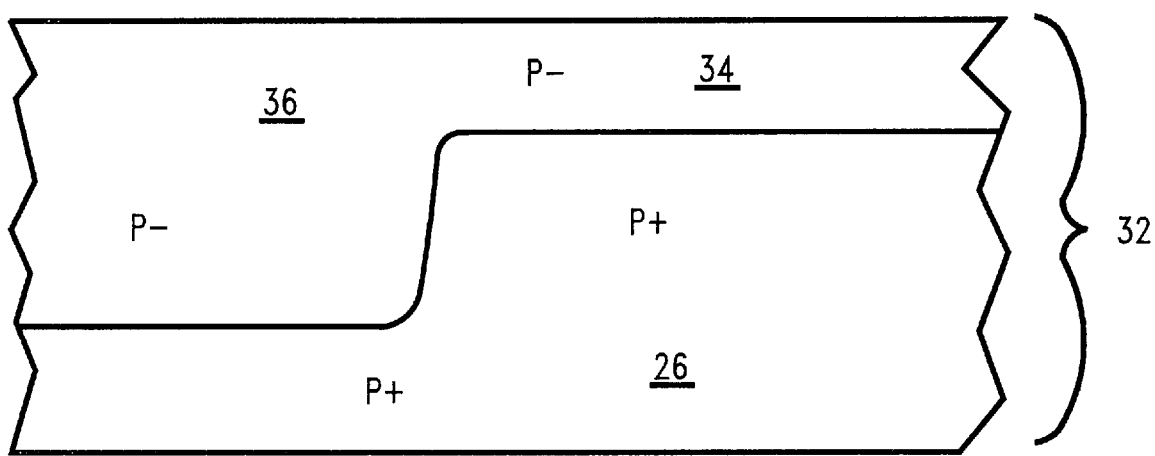

Another method, similar to the method of FIGS. 3a–d, is illustrated by FIGS. 5a–d. The method begins with a substrate 24 comprising a p+ layer 26 and a p– epitaxy layer 28. A deep ion implantation is performed implanting p-type ions as illustrated in FIG. 5b–c. The resulting substrate 32, illustrated in FIG. 5d, includes a thin p– area 34, thick p– area 36 and p+ region 42.

A thick region of light doping is required for red frequency response. A thin region of light doping is required for logic. Also, for each method, a p-type substrate is preferred; however, those skilled in the art will recognize that an n-type substrate may alternately be used, provided that the active devices are also suitably modified.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An active pixel sensor cell comprising:

a substrate doped at a first concentration and having a top surface;

a plurality of photosensitive devices and logic devices;

a layer doped at a second concentration extending a first distance from the top surface into the substrate beneath at least some of said logic devices; and said layer doped at a second concentration extending a second distance, which is greater than the first distance, from said top surface into said substrate beneath at least some of said photosensitive devices.

2. The device as claimed in claim 1 wherein a difference between the first and second distance is at least about one micrometer.

3. The device as claimed in claim 1 wherein said substrate and said doped layer are p-type.

4. The device as claimed in claim 1 wherein substrate and said doped layer are n-type.

5. An active pixel sensor cell device comprising:

a p– layer of varying thickness;

a logic region wherein said p– layer has a first thickness; and a pixel region adjacent to said logic region wherein said p– layer has a second thickness greater than the first thickness.

6. The device as claimed in claim 5 wherein said pixel region comprises at least one photosensitive device.

7. The device as claimed in claim 6 wherein said logic region comprises:

at least one transfer device in series with said photosensitive device adapted to transfer electrons from said photosensitive device;

at least one pre-charge device adapted to collect electrons which flow through said transfer device;

at least one source-follower device adapted to amplify the electrons collected by said pre-charged device; and at least one bit switch device adapted to control an output signal.

8. The device as claimed in claim 6 wherein said logic region comprises at least one logic device from the group consisting of a decoder, an embedded microprocessor, and a signal processing element, or similar circuitry.

* * * * *